United States Patent
Mehta et al.

(10) Patent No.: US 10,867,912 B2
(45) Date of Patent: Dec. 15, 2020

(54) DUMMY FILL SCHEME FOR USE WITH PASSIVE DEVICES

(71) Applicant: GLOBALFOUNDRIES Inc., Grand Cayman (KY)

(72) Inventors: Jaladhi Mehta, Clifton Park, NY (US); Brian Greene, Portland, OR (US); Daniel J. Dechene, Watervliet, NY (US); Ahmed Hassan, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/248,317

(22) Filed: Jan. 15, 2019

(65) Prior Publication Data

US 2020/0227350 A1 Jul. 16, 2020

(51) Int. Cl.
*H01L 29/00* (2006.01)
*H01L 23/522* (2006.01)
*H01L 49/02* (2006.01)
*H01L 21/76* (2006.01)
*H01L 29/78* (2006.01)
*H01L 21/8238* (2006.01)

(52) U.S. Cl.
CPC ......... *H01L 23/5228* (2013.01); *H01L 21/76* (2013.01); *H01L 28/20* (2013.01); *H01L 21/823821* (2013.01); *H01L 23/5223* (2013.01); *H01L 29/785* (2013.01)

(58) Field of Classification Search
CPC .................. H01L 21/76; H01L 28/20
USPC ........................................... 257/536
See application file for complete search history.

(56) References Cited

U.S. PATENT DOCUMENTS

| | | | |
|---|---|---|---|
| 7,403,094 B2 | 7/2008 | Beach et al. | |
| 7,485,540 B2 | 2/2009 | Chinthakindi et al. | |
| 8,361,848 B2 | 1/2013 | Lee et al. | |
| 9,349,639 B2 * | 5/2016 | Hung | H01L 21/76897 |
| 9,401,358 B1 * | 7/2016 | Hung | H01L 27/0802 |
| 9,583,493 B2 * | 2/2017 | Kim | H01L 23/5286 |
| 2016/0020148 A1 | 1/2016 | Song et al. | |
| 2019/0123143 A1 * | 4/2019 | Peng | H01L 29/1083 |

* cited by examiner

*Primary Examiner* — Tan N Tran
(74) *Attorney, Agent, or Firm* — Thompson Hine LLP; Anthony Canale

(57) ABSTRACT

Structures that include a passive device, such as a metal-based resistor, and methods of forming a structure that includes a passive device. The structure includes a semiconductor substrate, an interconnect structure including a passive device, and a dummy fill region arranged between the passive device and the semiconductor substrate. The dummy fill region includes a plurality of shallow trench isolation regions in the semiconductor substrate, a plurality of semiconductor fins, a plurality of source/drain regions in the plurality of semiconductor fins, and a plurality of contacts arranged over the plurality of shallow trench isolation regions.

16 Claims, 3 Drawing Sheets

DUMMY FILL SCHEME FOR USE WITH PASSIVE DEVICES

BACKGROUND

The present invention relates to semiconductor device fabrication and integrated circuits and, more specifically, to structures that include a passive device, such as a metal-based resistor, and methods of forming a structure that includes a passive device.

Complementary-metal-oxide-semiconductor (CMOS) processes may be used during front-end-of-line processing of a substrate to build a combination of p-type and n-type field-effect transistors that are used to construct, for example, logic cells. Field-effect transistors generally include a body providing a channel region, a source, a drain, and a gate electrode. When a control voltage exceeding a characteristic threshold voltage is applied to the gate electrode, carrier flow occurs in the channel region between the source and drain to produce a device output current. P-type field-effect transistors are formed in active regions that include n-wells in the substrate, and n-type field-effect transistors are formed in active regions that include p-wells in the substrate.

A fin-type field-effect transistor (FinFET) is a non-planar device structure that may be more densely packed in an integrated circuit than planar field-effect transistors. A fin-type field-effect transistor may include a fin consisting of a body of semiconductor material, a gate structure that wraps about the fin, and heavily-doped source/drain regions spaced along the fin and arranged on opposite sides of the gate structure. The source/drain regions are connected with contacts that enable subsequent vertical connections with metallization in an interconnect structure that is fabricated subsequent to front-end-of-line processing.

The interconnect structure includes interconnects that are connected with the field-effect transistors. Passive devices, such as metal-based resistors, may be formed in the interconnect structure. The passive devices are arranged in regions of an integrated circuit over dummy fill that is formed during front-end-of-line processing. The dummy fill is needed to minimize the topography during chemical mechanical polishing and, in particular, to lessen the topography generated beneath passive devices during chemical mechanical polishing. In the absence of an adequate density of the materials being polished, localized over-polishing can occur, which results in dishing and a non-planar surface after the polishing. Forming a passive device, such as a metal-based resistor, over a non-planar surface may adversely affect its performance. The dummy fill may include features of field-effect transistors that are fabricated in the conventional manner along with active field-effect transistors. The field-effect transistor features constituting conventional dummy fill results in a high level of capacitive coupling between the passive device and the substrate.

Improved structures that include a passive device, such as a metal-based resistor, and methods of forming a structure that includes a passive device are needed.

SUMMARY

In an embodiment of the invention, a structure includes a semiconductor substrate, an interconnect structure including a passive device, and a dummy fill region arranged between the passive device and the semiconductor substrate. The dummy fill region includes a plurality of shallow trench isolation regions in the semiconductor substrate, a plurality of semiconductor fins, a plurality of gate structures, a plurality of source/drain regions in the plurality of semiconductor fins, and a plurality of contacts arranged over the plurality of shallow trench isolation regions.

In an embodiment of the invention, a method includes forming a plurality of semiconductor fins projecting from a semiconductor substrate, forming a plurality of shallow trench isolation regions in the semiconductor substrate that surround the plurality of semiconductor fins, forming a plurality of source/drain regions in the plurality of semiconductor fins, and forming a plurality of contacts arranged over the plurality of shallow trench isolation regions. The method further includes forming an interconnect structure including a passive device arranged over the plurality of semiconductor fins, the plurality of contacts, and the plurality of shallow trench isolation regions, which provide a dummy fill region under the passive device.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
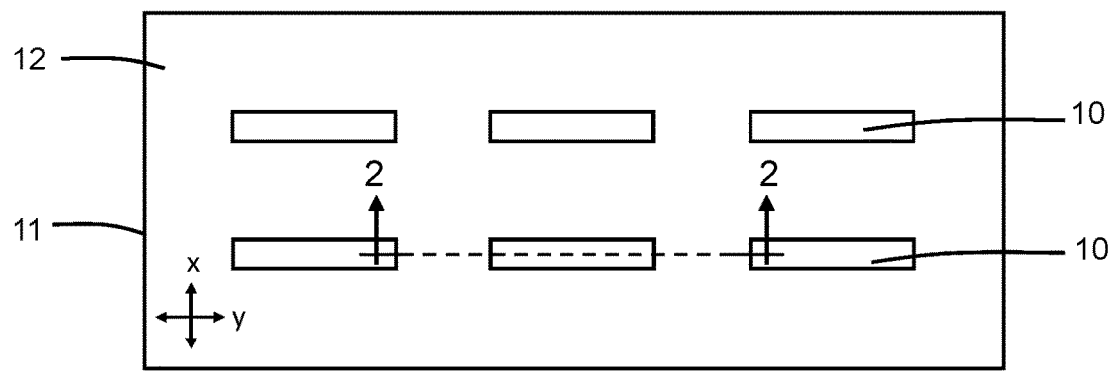
FIG. 1 is a top view of a structure at an initial fabrication stage of a processing method in accordance with embodiments of the invention.
Figure 2:
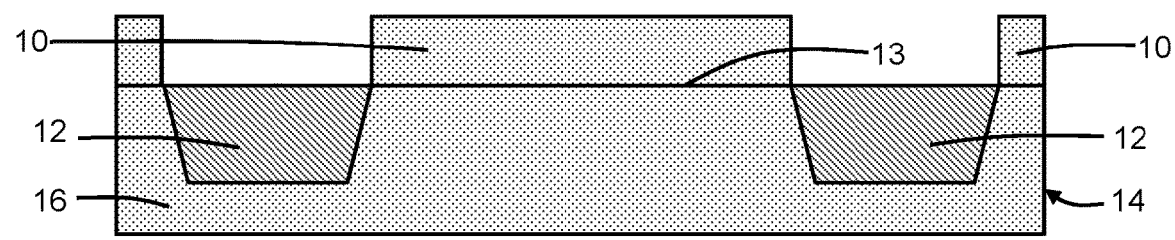
FIG. 2 is a cross-sectional view taken generally along line 2-2 in FIG. 1.

With reference to FIGS. 1, 2 and in accordance with embodiments of the invention, a structure includes semiconductor fins 10 that project upwardly away from a semiconductor substrate 14 and shallow trench isolation regions 12. The semiconductor fins 10 may be formed by patterning the single-crystal semiconductor material (e.g., single-crystal silicon) of the semiconductor substrate 14 with lithography and etching processes. The semiconductor fins 10 may be aligned in rows in a lengthwise direction (i.e., y-direction) and the different row may be laterally spaced apart in a direction (i.e., x-direction) orthogonal to the lengthwise direction.

The shallow trench isolation regions 12 extend from a top surface 13 of the semiconductor substrate 14 to a given depth beneath the top surface 13 of the semiconductor substrate 14 and surround the semiconductor fins 10. The shallow trench isolation regions 12 may be composed of a dielectric material, such as an oxide of silicon (e.g., silicon dioxide), deposited by chemical vapor deposition (CVD) into etched trenches in the semiconductor substrate 14, polished, and deglazed. The shallow trench isolation regions 12 isolate respective device regions of the semiconductor substrate 14 beneath the semiconductor fins 10. The shallow trench isolation regions 12 also define edges 11 of an outer boundary for a dummy fill region that is subsequently formed and over which a thin film resistor is also subsequently formed.

A moat region 16 is arranged in the semiconductor substrate 14 beneath the semiconductor fins 10. The moat region 16 extends to a depth in the semiconductor substrate 14 that is greater than the depth of the shallow trench isolation regions 12. Portions of the moat region 16 are respectively arranged inside the shallow trench isolation regions 12 and beneath each semiconductor fin 10 to provide active regions. The moat region 16 is composed of lightly-doped semiconductor material that provides a high impedance. For example, the moat region 16 may be lightly doped to contain a dopant concentration that is less than or equal to $5 \times 10^{15}$ cm$^{-3}$. The semiconductor substrate 14 over the moat region 16 is masked with an implantation mask during ion implantations forming n-wells and p-wells in other sections of the semiconductor substrate 14 during complementary-metal-oxide-semiconductor (CMOS) processing. As a result, the moat region 16 is not implanted with the dopants providing the n-wells and p-wells, and is free of those dopants.

Figure 3:
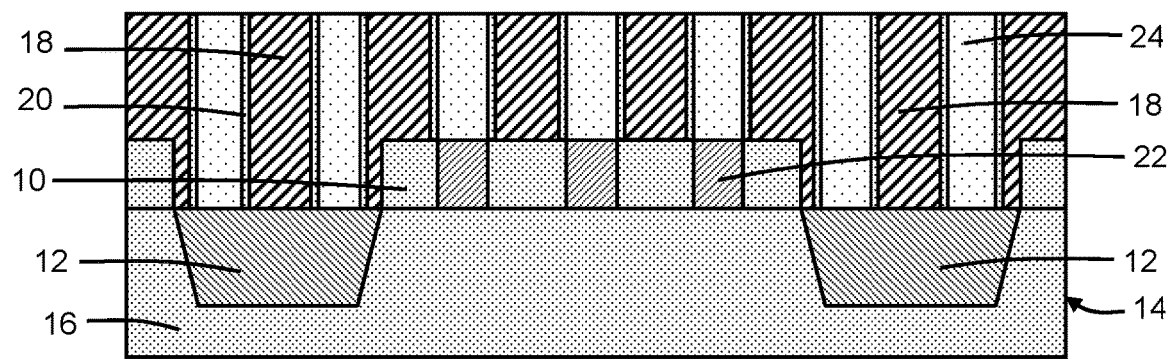
FIGS. 3-7 are cross-sectional views of a structure at successive fabrication stages of the processing method subsequent to FIG. 2.

With reference to FIG. 3 in which like reference numerals refer to like features in FIG. 2 and at a subsequent fabrication stage of the processing method, the structure further includes gate structures 18 that cross over the semiconductor fins 10 and the shallow trench isolation regions 12. The gate structures 18 extend along respective longitudinal axes transverse to the semiconductor fins 10, and some of the gate structures 18 overlap with and wrap about sections of the semiconductor fins 10. Each gate structure 18 may include a gate electrode and a gate dielectric between the gate electrode and the respective semiconductor fins 10, the gate electrode may include one or more conformal barrier metal layers and/or work function metal layers, such as metal layers composed of titanium aluminum carbide and/or titanium nitride, and/or a metal gate fill layer composed of a conductor, such as tungsten, cobalt, or aluminum, and the gate dielectric may be composed of a high-k dielectric material, such as hafnium oxide. The gate structures 18 may be formed as part of a replacement metal gate process.

Sidewall spacers 20 are arranged at the sidewalls of the gate structures 18. In an embodiment, the sidewall spacers 20 may formed from a layer composed of a dielectric material, such as a low-k dielectric material such as SiOCN, SiBCN, SiCO, SiOC, or SiC, that is conformally deposited by plasma-enhanced chemical vapor deposition or atomic layer deposition, and that is then etched with an anisotropic etching process.

Semiconductor layers 22 are formed in cavities etched in the semiconductor fins 10. The semiconductor layers 22 may be formed by an epitaxial growth process in which semiconductor material epitaxially grows from the exposed surfaces of semiconductor fins 10. The epitaxial semiconductor layers 22 furnish source/drain regions for a field-effect transistor formed using the semiconductor fins 10. As used herein, the term "source/drain region" means a doped region of semiconductor material that can function as either a source or a drain of a field-effect transistor. The epitaxial semiconductor layers 22 may contain silicon-germanium that is doped during epitaxial growth with a p-type dopant (e.g., boron, aluminum, gallium, and/or indium) to provide p-type electrical conductivity, and provide landing areas for source/drain regions contacts. Alternatively, the epitaxial semiconductor layers 22 may contain silicon that is doped during epitaxial growth with an n-type dopant (e.g., phosphorus and/or arsenic) to provide n-type electrical conductivity and that may optionally be doped with carbon.

An interlayer dielectric layer 24 is formed that includes sections that fill the spaces between the sidewall spacers 20 on the gate structures 18 over the epitaxial semiconductor layers 22 and the spaces between the sidewall spacers 20 on the gate structures 18 over the shallow trench isolation regions 12. The interlayer dielectric layer 24 may be composed of a dielectric material, such as an oxide of silicon (e.g., silicon dioxide), that is deposited by chemical vapor deposition and planarized. The replacement gate process forming the gate structures 18 may be performed after the interlayer dielectric layer 24 is formed.

Figure 4:
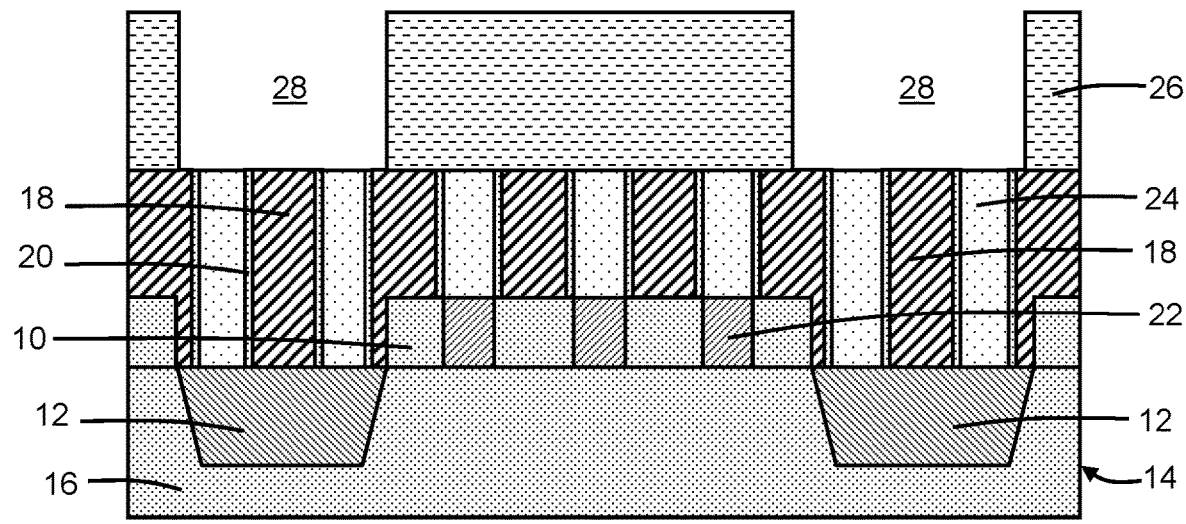

With reference to FIG. 4 in which like reference numerals refer to like features in FIG. 3 and at a subsequent fabrication stage of the processing method, an etch mask 26 is formed over the interlayer dielectric layer 24. The etch mask 26 includes openings 28 that expose sections of the gate structures 18 and sections of the interlayer dielectric layer 24 over the shallow trench isolation regions 12. The etch mask 26 may include material from an organic planarization layer (OPL) that is applied as a spin-on hardmask and then patterned by lithography and etching processes to provide the openings 28. The etch mask 26 covers the sections of the gate structures 18 and the sections of the interlayer dielectric layer 24 that are arranged over the semiconductor fins 10 and the epitaxial semiconductor layers 22 in the semiconductor fins 10.

Figure 5:
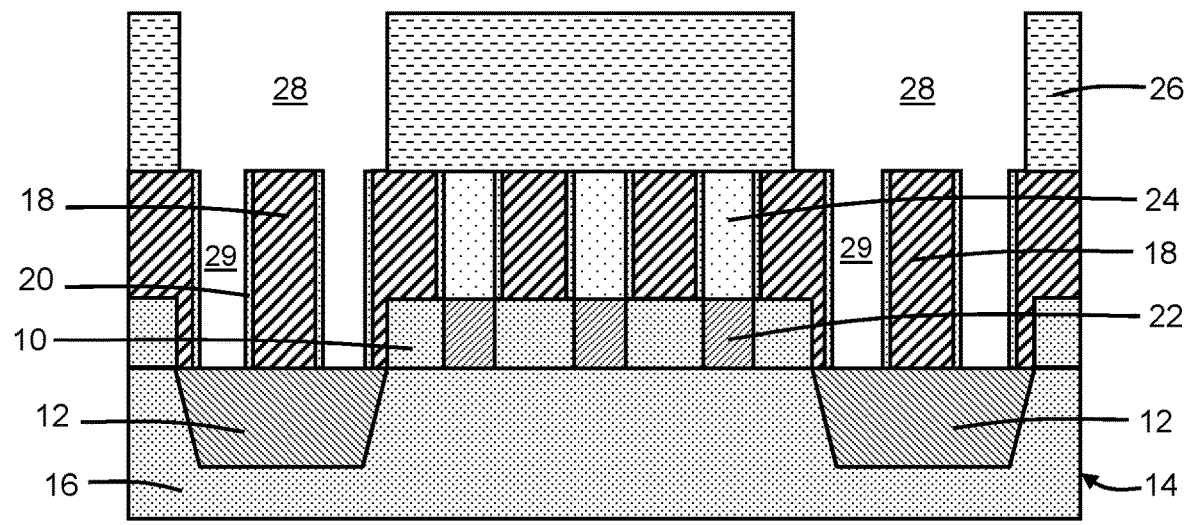

With reference to FIG. 5 in which like reference numerals refer to like features in FIG. 4 and at a subsequent fabrication stage of the processing method, the sections of the interlayer dielectric layer 24 over the shallow trench isolation regions 12 and between the gate structures 18, which are exposed by the openings 28 in the etch mask 26, are removed using an etching process. The etching process removes the dielectric material of the interlayer dielectric layer 24 selective to the materials of the gate structures 18 and sidewall spacers 20, and generates cavities 29. The sections of the interlayer dielectric layer 24 over the semiconductor fins 10 and between the gate structures 18 are masked by the etch mask 26 and are intact following the completion of the etching process.

Figure 6:
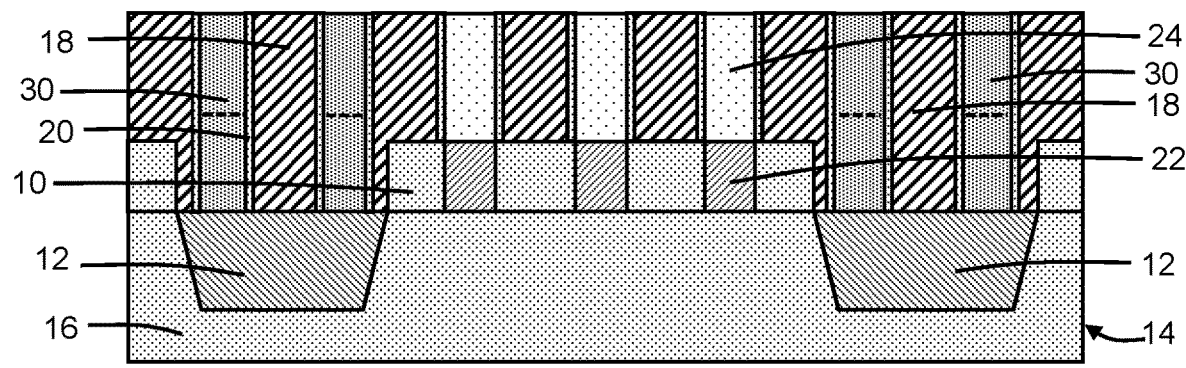

With reference to FIG. 6 in which like reference numerals refer to like features in FIG. 5 and at a subsequent fabrication stage of the processing method, the etch mask 26 is removed by, for example, ashing with an oxygen plasma. Contacts 30 are formed in the cavities 29 (FIG. 5) over the shallow trench isolation regions 12 and between the gate structures 18 that are opened by the selective removal of the sections of the interlayer dielectric layer 24. The sections of the interlayer dielectric layer 24 over the semiconductor fins 10 and between the gate structures 18 function to block the formation of contacts 30 extending to the epitaxial semiconductor layers 22.

The contacts 30 may be composed of a metal, a metal silicide, or a combination thereof. For example, the contacts 30 may include a lower portion composed of a metal silicide, such as tungsten silicide, titanium silicide, nickel silicide, or cobalt silicide, an upper portion composed of, for example, tungsten, and a liner (not shown) composed of, for example, titanium nitride about the upper portion. The upper and lower portions of the contacts 30, as well as the liner, may each be deposited by, for example, chemical vapor deposition, and the upper portion of the contacts 30 may planarized by chemical-mechanical polishing and recessed with a selective etching process. The contacts 30 may be arranged in direct physical contact the top surface 13 of the shallow trench isolation regions 12 and, in particular, respective lower portions of the contacts 30, which are comprised of metal silicide, may be arranged in direct physical contact with the top surface 13 of the shallow trench isolation regions 12.

Figure 7:
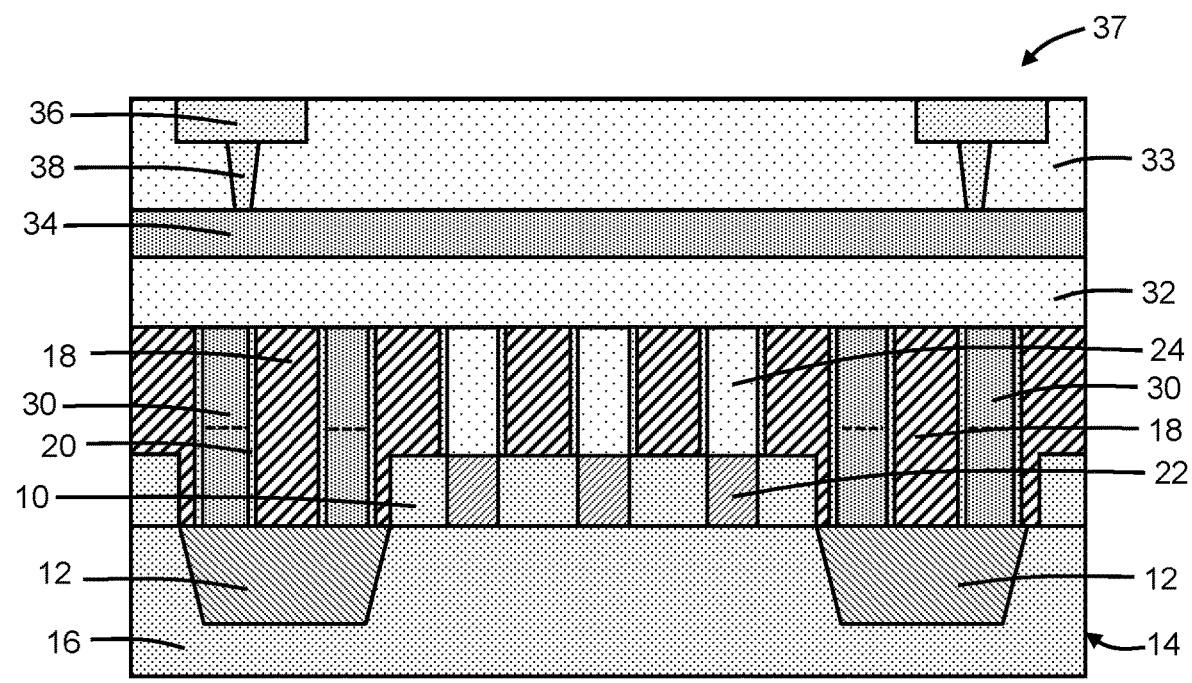

With reference to FIG. 7 in which like reference numerals refer to like features in FIG. 6 and at a subsequent fabrication stage of the processing method, middle-of-line (MOL) processing and back-end-of-line (BEOL) processing follow to form an interconnect structure 37. The interconnect structure 37 includes interlayer dielectric layers 32, 33, a thin film resistor 34 that may be formed by, for example, MOL processing, and wires or interconnects 36 connected by the contacts 38 with the thin film resistor 34. The interconnect structure 37 may be connected with active and passive devices (not shown) in other regions of the semiconductor substrate 14.

The contacts 38 may be composed of a metal, such as tungsten, copper, or cobalt, and are located in respective etched contact openings in the interlayer dielectric layer 33. The interlayer dielectric layers 32, 33 may be composed of a dielectric material, such as an oxide of silicon, deposited by chemical vapor deposition and planarized with, for example, chemical mechanical polishing (CMP). For example, the interlayer dielectric layers 32, 33 may be composed of silicon dioxide deposited by chemical vapor deposition using ozone and tetraethylorthosilicate (TEOS) as reactants.

The thin film resistor 34 is arranged in the interconnect structure 37 over the semiconductor fins 10, gate structures 18, and contacts 30, which participate in forming a dummy fill region beneath the thin film resistor 34. In an embodiment, the thin film resistor 34 may have a footprint (i.e., projected area at the top surface 13 of the semiconductor substrate 14) that is equal or substantially equal to the perimeter or footprint of the dummy fill region, which is established by the edges 11 (FIG. 1). The gate structures 18 participating in the dummy fill region are non-active or dummy gates and the contacts 30 participating in the dummy fill region are not connected with metallization in the overlying interconnect structure 37. In particular, the interlayer dielectric layer 32 arranged between the thin film resistor 34 and the dummy fill region does not include contacts, and is continuous and unbroken over the dummy fill region. The thin film resistor 34 may be composed of a metal, such as nickel-chromium, tantalum nitride, titanium nitride, or tungsten nitride, that is deposited on the interlayer dielectric layer 32 and then patterned to provide a shape of a given size, and that is then covered after patterning by the interlayer dielectric layer 33. The thin film resistor 34, which is metal-based, may have a lower temperature coefficient of resistance than conventional polysilicon resistors in order to provide high precision during operation.

The arrangement of the contacts 30 over only the shallow trench isolation regions 12 differs from a conventional arrangement in which the contacts are only arranged over the semiconductor layers 22 in the semiconductor fins 10. The dielectric material of the shallow trench isolation regions 12 located beneath the contacts 30 has a permittivity (i.e., dielectric constant) that is greater than the permittivity of doped semiconductor materials in the conventional arrangement. Placing the contacts 30 of the dummy fill region over the dielectric material of the shallow trench isolation regions 12 operates to eliminate the path for parasitic currents. Not placing the contacts 30 of the dummy fill region over the semiconductor fins 10 operates to reduce capacitive coupling between the thin film resistor 34 and the semiconductor substrate 14. The arrangement of the moat region 16 in the semiconductor substrate 14 differs from a conventional arrangement in which doped wells are arranged beneath the semiconductor fins 10. The moat region 16 has a higher impedance, which operates to reduce the coupling capacitance between the thin film resistor 34 and the semiconductor substrate 14. The reduced capacitive coupling between the thin film resistor 34 and the semiconductor substrate 14 may improve the frequency response of the thin film resistor 34. The dummy fill may enable more precise topography control to provide tighter electrical variation and control over resistance matching multiple among different thin film resistors 34 that are fabricated on a chip, on different chips, or on different wafers, and may also efficiently transfer heat generated by the thin film resistor 34 away from the thin film resistor 34.

The dummy fill region that includes the relocated contacts 30 provides a structure that is scalable with the dimensions of the thin film resistor 34. The density requirements for the dummy fill region can be satisfied without the conventional reliance upon unit cells (i.e., smallest repeatable units) that are identical to the field-effect transistor shapes. Conventional dummy fill based on unit cells may have a footprint that is larger than the footprint of the thin film resistor, which results in wasted chip area about the outer boundary of the thin film resistor. In contrast, the footprint of the inventive dummy fill region, which is established by the edges 11 (FIG. 1), may be equal or substantially equal to the footprint of the thin film resistor 34. In an embodiment, the edges of the thin film resistor 34 may be symmetrically (i.e., vertically and horizontally) aligned with the edges 11 of the dummy fill region. In an embodiment, the edges 11 of the dummy fill region may be substantially aligned with the edges of the thin film resistor 34. In an embodiment, the edges 11 of the dummy fill region may be aligned in two orthogonal directions (i.e., the x-direction and y-direction) with respective orthogonal edges of the thin film resistor 34 such that the edges 11 of the dummy fill region and thin film resistor 34 are displaced from each other vertically and coincident laterally.

In alternative embodiments, the dummy fill region may be used in conjunction with other types of passive devices, such as metal-insulator-metal capacitors, that are formed in the interconnect structure 37.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a semiconductor substrate;
   an interconnect structure including a passive device; and
   a dummy fill region arranged between the passive device and the semiconductor substrate, the dummy fill region including a plurality of shallow trench isolation regions in the semiconductor substrate, a plurality of semiconductor fins, a plurality of gate structures, a plurality of source/drain regions in the plurality of semiconductor fins, a plurality of contacts arranged over the plurality of shallow trench isolation regions, and each contact including a metal silicide layer in direct physical contact with one of the plurality of shallow trench isolation regions; and
   a moat region in the semiconductor substrate beneath the dummy fill region,
   wherein the moat region contains a dopant concentration that is less than or equal to $5 \times 10^{15}$ cm$^{-3}$.

2. The structure of claim 1 wherein the semiconductor substrate has a top surface, the plurality of shallow trench isolation regions extend from the top surface of the semiconductor substrate to a first depth, and the moat region extends from the top surface of the semiconductor substrate to a second depth that is greater than the first depth of the plurality of shallow trench isolation regions.

3. The structure of claim 1 wherein the plurality of shallow trench isolation regions surround a plurality of sections of the moat region that are respectively arranged beneath the plurality of semiconductor fins.

4. The structure of claim 1 further comprising:
   an interlayer dielectric layer including a plurality of sections arranged directly over the plurality of source/drain regions.

5. The structure of claim 4 wherein the plurality of source/drain regions are not contacted by the plurality of contacts, and the plurality of contacts are only arranged over the plurality of shallow trench isolation regions.

6. The structure of claim 4 wherein the plurality of gate structures are arranged to overlap with the plurality of semiconductor fins, the plurality of source/drain regions are arranged in the plurality of semiconductor fins between the plurality of gate structures, and the plurality of sections of the interlayer dielectric layer are arranged over the plurality of source/drain regions respectively between the plurality of gate structures.

7. The structure of claim 1 wherein the passive device is displaced in a vertical direction from the dummy fill region, the dummy fill region includes a first plurality of edges, and the passive device includes a second plurality of edges that are substantially aligned with the first plurality of edges of the dummy fill region.

8. The structure of claim 7 wherein the first plurality of edges of the dummy fill region are substantially aligned in two orthogonal directions with the second plurality of edges of the passive device.

9. The structure of claim 1 wherein the passive device is a thin film resistor.

10. The structure of claim 1 wherein the plurality of gate structures are arranged to overlap with the plurality of semiconductor fins and the plurality of shallow trench isolation regions, and the plurality of contacts are arranged over the plurality of shallow trench isolation regions respectively between the plurality of gate structures.

11. A structure comprising:
    a semiconductor substrate;
    an interconnect structure including a passive device;
    a dummy fill region arranged between the passive device and the semiconductor substrate, the dummy fill region including a plurality of shallow trench isolation regions in the semiconductor substrate, a plurality of semiconductor fins, a plurality of gate structures, a plurality of source/drain regions in the plurality of semiconductor fins, and a plurality of contacts arranged over the plurality of shallow trench isolation regions; and
    a moat region in the semiconductor substrate beneath the dummy fill region,
    wherein the plurality of contacts have a directly contacting relationship with the plurality of shallow trench isolation regions, the plurality of gate structures are arranged to overlap with the plurality of semiconductor fins and the plurality of shallow trench isolation regions, the plurality of contacts are arranged over the plurality of shallow trench isolation regions respectively between the plurality of gate structures, and the moat region contains a dopant concentration that is less than or equal to $5 \times 10^{15}$ cm$^{-3}$.

12. A method comprising:
    forming a plurality of semiconductor fins projecting from a semiconductor substrate;
    forming a plurality of shallow trench isolation regions in the semiconductor substrate that surround the plurality of semiconductor fins;
    forming a plurality of source/drain regions in the plurality of semiconductor fins;
    forming a plurality of contacts arranged over the plurality of shallow trench isolation regions;
    forming a moat region in the semiconductor substrate beneath a dummy fill region provided by the plurality of semiconductor fins, the plurality of contacts, and the plurality of shallow trench isolation regions; and
    forming an interconnect structure including a passive device arranged over the dummy fill region,
    wherein each contact includes a metal silicide layer in direct physical contact with one of the shallow trench isolation regions, and the moat region contains a dopant concentration that is less than or equal to $5 \times 10^{15}$ cm$^{-3}$.

13. The method of claim 12 further comprising:

forming sections of an interlayer dielectric layer including a plurality of sections arranged directly over the plurality of source/drain regions; and forming a plurality of gate structures arranged to overlap with the plurality of semiconductor fins, wherein the plurality of source/drain regions are arranged in the plurality of semiconductor fins between the plurality of gate structures, and the plurality of sections of the interlayer dielectric layer are arranged over the plurality of source/drain regions between the plurality of gate structures.

14. The method of claim 12 wherein the passive device is displaced in a vertical direction from the dummy fill region, the dummy fill region includes a first plurality of edges, and the passive device includes a second plurality of edges that are substantially aligned in two orthogonal directions with the first plurality of edges of the dummy fill region.

15. The method of claim 12 wherein the passive device is a thin film resistor.

16. The method of claim 12 further comprising:

forming a plurality of gate structures arranged to overlap with the plurality of semiconductor fins and the plurality of shallow trench isolation regions, wherein the plurality of contacts are arranged over the plurality of shallow trench isolation regions between the plurality of gate structures.

* * * * *

UNITED STATES PATENT AND TRADEMARK OFFICE
CERTIFICATE OF CORRECTION

PATENT NO. : 10,867,912 B2  
APPLICATION NO. : 16/248317  
DATED : December 15, 2020  
INVENTOR(S) : Jaladhi Mehta et al.

Page 1 of 1

It is certified that error appears in the above-identified patent and that said Letters Patent is hereby corrected as shown below:

In the Claims

At Column 7, Claim No. 1, Line number 33, after "device;" delete "and"

At Column 7, Claim No. 1, Line number 40, after "fins," insert --and--

At Column 7, Claim No. 1, Line number 41, after "regions," delete "and"

Signed and Sealed this  
Ninth Day of February, 2021

Drew Hirshfeld  
*Performing the Functions and Duties of the*  
*Under Secretary of Commerce for Intellectual Property and*  
*Director of the United States Patent and Trademark Office*